US009653676B2

(12) United States Patent
Araki

(10) Patent No.: US 9,653,676 B2
(45) Date of Patent: May 16, 2017

(54) METHOD FOR MANUFACTURING PIEZOELECTRIC DEVICE

(71) Applicant: Murata Manufacturing Co., Ltd., Nagaokakyo, Kyoto-fu (JP)

(72) Inventor: Kiyoto Araki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 264 days.

(21) Appl. No.: 14/259,369

(22) Filed: Apr. 23, 2014

(65) Prior Publication Data

US 2014/0231382 A1    Aug. 21, 2014

Related U.S. Application Data

(60) Division of application No. 13/568,157, filed on Aug. 7, 2012, now Pat. No. 8,749,119, which is a
(Continued)

(30) Foreign Application Priority Data

Feb. 9, 2010  (JP) ................. 2010-026135

(51) Int. Cl.
  *H01L 41/29*    (2013.01)
  *H03H 3/02*    (2006.01)
  (Continued)

(52) U.S. Cl.
  CPC ........ *H01L 41/29* (2013.01); *H01L 21/31144* (2013.01); *H01L 41/0475* (2013.01);
  (Continued)

(58) Field of Classification Search
  CPC ...... H03H 3/02; H03H 9/02047; H03H 9/173; H03H 2003/021; G01C 19/5783;
  (Continued)

(56) References Cited

U.S. PATENT DOCUMENTS 4,078,284 A * 3/1978 Capek ............... Y10T 29/42
  252/62.9 R
2004/0241984 A1* 12/2004 Schwan ........... H01L 21/31144
  438/637
(Continued)

FOREIGN PATENT DOCUMENTS

JP    2007208728 A  *  8/2007

OTHER PUBLICATIONS

Araki, "Piezoelectric Device and Method for Manufacturing Piezoelectric Device", U.S. Appl. No. 13/568,157, filed Aug. 7, 2012.

Primary Examiner — A. Dexter Tugbang
(74) Attorney, Agent, or Firm — Keating & Bennett, LLP

(57) ABSTRACT

A method for manufacturing a piezoelectric device including a piezoelectric thin film, a support member, a first electrode, and a cavity formed at a support member side of the first electrode between the piezoelectric thin film and the support member includes forming a sacrificial layer in an area to define the cavity, forming an etching adjustment layer which adjusts progress of etching in a region where the first electrode is exposed to a side of the piezoelectric thin film, simultaneously forming a through hole through which a portion of the sacrificial layer is exposed to the side of the piezoelectric thin film and an opening which the first electrode is exposed to the side of the piezoelectric thin film by etching the piezoelectric thin film and the etching adjustment layer, and removing the sacrificial layer through the through hole.

12 Claims, 15 Drawing Sheets

Related U.S. Application Data continuation of application No. PCT/JP2011/051723, filed on Jan. 28, 2011.

(51) Int. Cl.
*H01L 21/311* (2006.01)
*H03H 9/17* (2006.01)
*H01L 41/047* (2006.01)
*H01L 41/332* (2013.01)
*H01L 41/312* (2013.01)
*H03H 9/02* (2006.01)
*H01L 41/113* (2006.01)
*G01C 19/5783* (2012.01)

(52) U.S. Cl.
CPC .......... *H01L 41/312* (2013.01); *H01L 41/332* (2013.01); *H03H 3/02* (2013.01); *H03H 9/02047* (2013.01); *H03H 9/173* (2013.01); *G01C 19/5783* (2013.01); *H01L 41/1138* (2013.01); *H03H 2003/021* (2013.01); *Y10T 29/42* (2015.01)

(58) Field of Classification Search
CPC . H01L 41/0475; H01L 41/1138; H01L 41/29; H01L 41/312; H01L 41/332; H01L 41/31144; Y10T 29/42
See application file for complete search history.

(56) References Cited

U.S. PATENT DOCUMENTS

2006/0128140 A1* 6/2006 Kim .................. H01L 21/31144
438/637
2010/0052472 A1* 3/2010 Nishino .................. H01L 41/29
310/313 D \* cited by examiner

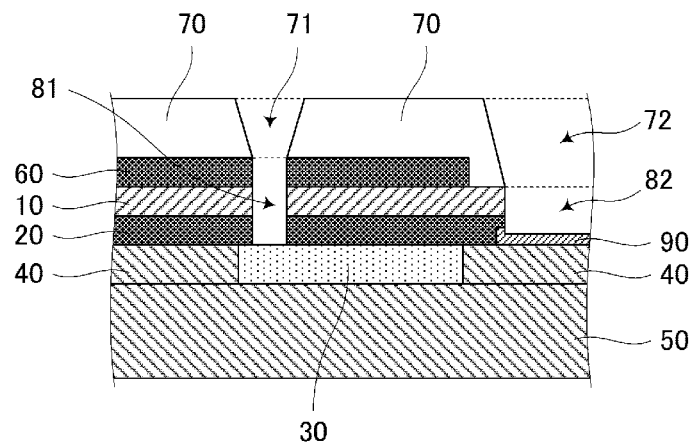
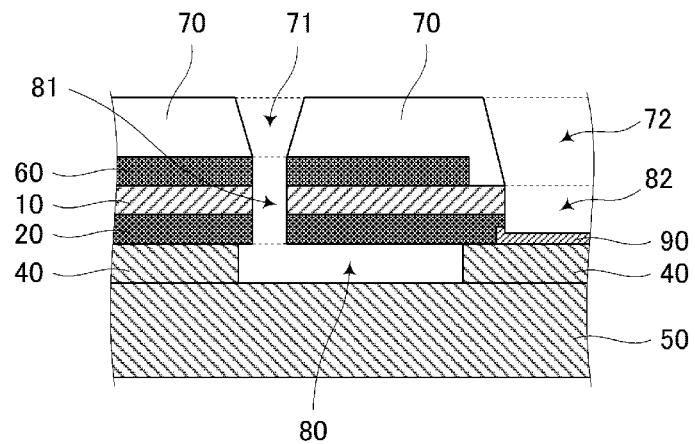

METHOD FOR MANUFACTURING PIEZOELECTRIC DEVICE

BACKGROUND OF THE INVENTION

1. Field of the Invention

The present invention relates to a piezoelectric device including a piezoelectric single crystal thin film, in particular, a piezoelectric device having a membrane structure, and a method for manufacturing the piezoelectric device.

2. Description of the Related Art

At present, a large number of piezoelectric devices with a thin film of a piezoelectric single crystal have been developed. The piezoelectric devices employing such a piezoelectric thin film require a support member which supports the piezoelectric thin film when actually assembled. Such a support member is disposed on one principal surface of the piezoelectric thin film. In this case, the support member is not disposed in a vibration region, which actually functions as the piezoelectric device, of the piezoelectric thin film, and the support member is disposed only in a non-vibration region, which does not function as the piezoelectric device, of the piezoelectric thin film. This structure is referred to as a so-called membrane structure.

A method for manufacturing an existing piezoelectric device having the membrane structure is described with reference to FIGS. 1A and 1B.

FIGS. 1A and 1B are views schematically illustrating the method for manufacturing an existing piezoelectric device. FIG. 1A is a cross sectional view of the device after performing the steps of forming a composite substrate of a piezoelectric thin film 10 and support members 40 and 50 including a sacrificial layer 30 that is to be a cavity 80 and a lower electrode 20; and forming an upper electrode 60 on the surface of the piezoelectric thin film 10. In this state, the lower electrode 20 and the sacrificial layer 30 are completely covered with the piezoelectric thin film 10 and the support members 40 and 50. Therefore, it is required to form an opening portion 82 through which the lower electrode 20 is exposed to the side of the piezoelectric thin film 10, and a through hole 81 through which a portion of the sacrificial layer 30 is exposed to the side of the piezoelectric thin film 10.

Thus, a lower electrode exposure process is performed by applying a resist film to the top surface of the piezoelectric thin film 10, forming an etching window in a region of the resist film through which the lower electrode 20 is exposed, and etching to thereby form the opening portion 82 in the piezoelectric thin film 10.

Next, a sacrificial layer exposure process is performed by applying a resist film to the top surface of the piezoelectric thin film 10 again, forming an etching window in a region of the resist film through which the sacrificial layer 30 is exposed, and etching to thereby form the through hole 81 in the upper electrode 60, the piezoelectric thin film 10, and the lower electrode 20.

Next, a sacrificial layer removal process for removing the sacrificial layer 30 through the through hole 81 is performed. Thus, the sacrificial layer 30 is formed to be the cavity 80.

Finally, a lead-out wiring 63A is formed between the upper electrode 60 and a bump pad (not illustrated) and a lead-out wiring 63B is formed between the lower electrode 20 and a bump pad (not illustrated).

The etching depth in the lower electrode exposure process described above and the etching depth in the sacrificial layer exposure process described above are different each other. More specifically, it is required in the lower electrode exposure process to perform etching corresponding to the thickness of the piezoelectric thin film 10 in such a manner that the lower electrode 20 is not etched, and it is required in the sacrificial layer exposure process to perform etching corresponding to the thickness of the piezoelectric thin film 10 and the total thickness of the thickness of the upper electrode 60 and the thickness of the lower electrode 20. Therefore, these two etching processes are different in etching depth or etching material. Thus, the etching processes have been carried out in discrete processes.

Japanese Unexamined Patent Application Publication No. 2007-228319 discloses a method for bonding a lower electrode and a piezoelectric substrate to each other to form a piezoelectric thin film on the surface of the lower electrode.

However, in the existing manufacturing method, etching is separately performed in the sacrificial layer exposure process and the lower electrode exposure process, so that the etching is carried out twice in total. Therefore, damage to the piezoelectric thin film 10 caused by the etching processes has been serious. In particular, when dry etching has been performed in the sacrificial layer exposure process and in the lower electrode exposure process, the piezoelectric thin film 10 is electrically charged, so that polarization degradation may occur in the piezoelectric thin film 10 by the charges in some cases.

Moreover, in each process of the sacrificial layer exposure process and the lower electrode exposure process, the time required for the etching process, which includes a resist film applying step, a photolithography step, and an etching step, is long, which is one of the causes of a high manufacturing cost.

SUMMARY OF THE INVENTION

Therefore, preferred embodiments of the present invention provide a piezoelectric device in which damage to the piezoelectric thin film caused by etching can be significantly reduced and prevented, and the cost of manufacturing the piezoelectric device can be significantly reduced by reducing the number of etching steps, and also provide a method for manufacturing the piezoelectric device.

According to a preferred embodiment of the present invention, a piezoelectric device includes a piezoelectric thin film, a support member which is bonded to a rear surface of the piezoelectric thin film to support the piezoelectric thin film, a first electrode located on the rear surface of the piezoelectric thin film, and a cavity formed at the support member side of the first electrode between the piezoelectric thin film and the support member.

According to another preferred embodiment of the present invention, a method for manufacturing a piezoelectric device at least includes a sacrificial layer formation process, an adjustment layer formation process, an exposure process, and a sacrificial layer removal process.

In the sacrificial layer formation process, a sacrificial layer is formed in an area to be the cavity. In the adjustment layer formation process, an etching adjustment layer, which adjusts the progress of etching in a region where the first electrode is exposed to the side of the piezoelectric thin film, is formed. In the exposure process, the piezoelectric thin film and the etching adjustment layer are etched to simultaneously form a through hole through which a portion of the sacrificial layer is exposed to the side of the piezoelectric thin film and an opening portion which the first electrode is exposed to the side of the piezoelectric thin film. In the sacrificial layer removal process, the sacrificial layer is removed through the through hole.

In this manufacturing method, even when the etching depth is different between the depth in the formation of the through hole and the depth in the formation of the opening portion, the etching rate in the formation of the opening portion is adjusted by the etching adjustment layer. Therefore, when the formation of the through hole and the formation of the opening portion are simultaneously carried out, the formation of the etching adjustment layer using a material with a known etching rate and with a predetermined thickness causes the first electrode to remain after the etching process whose time is determined based on the formation of the through hole through which the sacrificial layer is exposed.

Therefore, in this manufacturing method, the sacrificial layer exposure process and the lower electrode exposure process which have been performed in a former manufacturing step can be simultaneously performed. More specifically, since the etching step only needs to be performed once, damage to the piezoelectric thin film caused by etching is significantly reduced and prevented. Even when dry etching is performed in the exposure process, polarization degradation in the piezoelectric thin film is significantly reduced and prevented.

Since the time required for performing the etching process including the resist film applying step, the photolithography step, and the etching step becomes almost half of the existing etching process, the manufacturing cost can be significantly reduced.

Accordingly, in a preferred embodiment of the present invention, damage to the piezoelectric thin film caused by etching can be significantly reduced and prevented, and also the manufacturing cost of the piezoelectric device can be significantly reduced.

A method for manufacturing the piezoelectric device according to a preferred embodiment of the present invention at least includes an ion implantation process, a bonding process, and a separation and formation process.

In the ion implantation process, by implanting ions into a piezoelectric single crystal substrate, an ion implantation layer, where the concentration of the implanted ions achieves a maximum value, is formed in the piezoelectric single crystal substrate. In the bonding process, the piezoelectric single crystal substrate, on which the ion implantation layer is formed, and the support member, are bonded to each other. In the separation and formation process, the piezoelectric thin film in the form of a single crystal is separated from the piezoelectric single crystal substrate to form a single crystal piezoelectric thin film on the surface of the first electrode.

This manufacturing method specifically shows the formation method of the piezoelectric thin film described above. In this manufacturing method, the single crystal piezoelectric thin film is formed by the ion implantation process, the bonding process, and the separation and formation process. By forming the piezoelectric thin film in the form of a single crystal, a thin film can be formed whose piezoelectricity is more excellent than that of a polycrystalline film formed by sputtering, vapor deposition, CVD, or the like. The crystal orientation of the piezoelectric single crystal substrate depends on the crystal orientation of the piezoelectric thin film. Therefore, by preparing a piezoelectric single crystal substrate having a suitable crystal orientation for the desired characteristics of a piezoelectric device, a piezoelectric thin film having a desired crystal orientation can be formed. Since single crystal thin films are formed from one piezoelectric single crystal substrate by repeating an ion implantation process, a bonding process, and a separation process, a plurality of piezoelectric thin films can be formed from one substrate. Therefore, a loss of a single crystal piezoelectric material can be reduced.

In a method for manufacturing a piezoelectric device according to a preferred embodiment of the present invention, the material of the piezoelectric thin film preferably is lithium tantalate or lithium niobate, for example.

When the piezoelectric thin film is formed with a material which is difficult to be etched, such as lithium tantalate or lithium niobate, the time required for etching takes long. Therefore, in a manufacturing method according to a preferred embodiment of the present invention, the manufacturing cost can be significantly reduced.

In a method for manufacturing a piezoelectric device according to a preferred embodiment of the present invention, in the adjustment layer formation process, the etching adjustment layer is formed preferably at the rear surface side of the piezoelectric thin film.

The manufacturing method specifically shows the position where the etching adjustment layer is formed. In this manufacturing method, the piezoelectric thin film is etched before the etching adjustment layer.

In a method for manufacturing a piezoelectric device according to a preferred embodiment of the present invention, in the adjustment layer formation process, the etching adjustment layer is preferably formed at the support member side of the first electrode.

The manufacturing method specifically shows the position where the etching adjustment layer is formed described above. In the manufacturing method according to a preferred embodiment of the present invention, the piezoelectric thin film is etched before the etching adjustment layer, and the first electrode is etched before the etching adjustment layer.

In a method for manufacturing a piezoelectric device according to a preferred embodiment of the present invention, in the adjustment layer formation process, the etching adjustment layer is preferably formed between the piezoelectric thin film and the first electrode.

The manufacturing method shows the position where the etching adjustment layer is formed described above. In the manufacturing method according to a preferred embodiment of the present invention, the piezoelectric thin film is etched before the etching adjustment layer and the etching adjustment layer is etched before the first electrode.

In a method for manufacturing a piezoelectric device according to a preferred embodiment of the present invention, in the adjustment layer formation process, the etching adjustment layer is preferably formed with a conductive material.

In the manufacturing method, since the etching adjustment layer is conductive, the etching adjustment layer can be used as an electrode. Therefore, a lead-out wiring connected to a bump pad can be formed on the piezoelectric thin film, directly or from the etching adjusting layers electrically connected through the first electrode.

In a method for manufacturing a piezoelectric device according to a preferred embodiment of the present invention, in the adjustment layer formation process, the etching adjustment layer is preferably formed with a material whose etching rate is lower than that of the first electrode.

In this manufacturing method, since the etching adjustment layer is formed with a material whose etching rate is lower than that of the first electrode, the etching rate of the etching adjustment layer is lower than that of the first electrode. More specifically, the etching rate can be adjusted in such a manner that the formation rate of the through hole is higher than that of the formation rate of the opening portion.

In a method for manufacturing a piezoelectric device according to a preferred embodiment of the present invention, in the adjustment layer formation process, the etching adjustment layer is preferably formed with a metal material.

In the manufacturing method according to a preferred embodiment of the present invention according to a preferred embodiment of the present invention, since the etching adjustment layer is metallic, the etching adjustment layer is likely to adhere to the first electrode. Since the etching adjustment layer is conductive, the etching adjustment layer can be used as an electrode. Therefore, a lead-out wiring connected to a bump pad can be formed on the piezoelectric thin film from the etching adjustment layer electrically connected through the first electrode.

In a method for manufacturing a piezoelectric device according to a preferred embodiment of the present invention, in the adjustment layer formation process, the etching adjustment layer is preferably formed with a metal material containing any one of Al, Cu, Ni, Cr, and Pt, for example.

In the manufacturing method according to a preferred embodiment of the present invention, Al and Cu are materials having a low fluorine plasma etching rate and high conductivity. Ni, Cr, and Pt are materials whose etching rate is lower than that of Al and Cu.

In a method for manufacturing a piezoelectric device according to a preferred embodiment of the present invention, in the adjustment layer formation process, the etching adjustment layer is preferably formed on the surface of the piezoelectric thin film.

The manufacturing method specifically shows the position where the etching adjustment layer is formed described above. In the manufacturing method according to a preferred embodiment of the present invention, the etching adjustment layer is etched preferably before the piezoelectric thin film. In the manufacturing method according to a preferred embodiment of the present invention, the etching adjustment layer is preferably formed on the surface of the piezoelectric thin film. Therefore, the thickness of the etching adjustment layer can be freely finely adjusted.

In a method for manufacturing a piezoelectric device according to a preferred embodiment of the present invention, in the adjustment layer formation process, the etching adjustment layer is formed in such a way the thickness and material are preferably the same as those of the first electrode and the second electrode.

In a method for manufacturing a piezoelectric device according to a preferred embodiment of the present invention, when the thickness of the first electrode formed on the rear surface of the piezoelectric thin film is defined as A, the thickness of the second electrode formed on the surface of the piezoelectric thin film is defined as B, the thickness of the etching adjustment layer is defined as C, the etching rate of the first electrode is defined as $\alpha$, the etching rate of the second electrode is defined as $\beta$, and the etching rate of the etching adjustment layer is defined as $\gamma$, in the adjustment layer formation process, the etching adjustment layer is preferably formed with a thickness and a material which satisfy the equation of $A/\alpha + B/\beta = C/\gamma$.

This manufacturing method specifies the equation for determining the thickness and the material of the etching adjustment layer described above. In this manufacturing method, the material and the thickness of the etching adjustment layer, with which the etching time required for the formation of the through hole and the etching time required for the formation of the opening portion are equal to each other can be calculated by the equation to be determined.

In a method for manufacturing a piezoelectric device according to a preferred embodiment of the present invention, the processes to the sacrificial layer removal process are preferably performed in a wafer level in which a plurality of piezoelectric devices can be simultaneously formed, and the method has a dividing process of dividing into the plurality of piezoelectric devices after the sacrificial layers are removed.

In a manufacturing method according to a preferred embodiment of the present invention, all the processes to the sacrificial layer removal process are preferably performed in a wafer level. The dividing process in the manufacturing method is preferably performed after the sacrificial layer removal process. By the dividing process, one piezoelectric device is completed.

As described above, a plurality of piezoelectric devices can be manufactured at one time (i.e., simultaneously). Therefore, the manufacturing cost of the piezoelectric device can be significantly reduced.

According to various preferred embodiments of the present invention, damage to the piezoelectric thin film caused by etching can be significantly reduced and prevented, and the manufacturing cost of the piezoelectric device can also be significantly reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A and 6B are views schematically illustrating the method for manufacturing the piezoelectric device illustrated in FIG. 2.

DETAILED DESCRIPTION OF THE PREFERRED EMBODIMENTS

A method for manufacturing a piezoelectric device according to a first preferred embodiment of the present invention is described with reference to the drawings. The following description of a thin film piezoelectric device (FBAR: Film Bulk Acoustic Resonator) is provided as an example of a piezoelectric device.

Figure 1A:
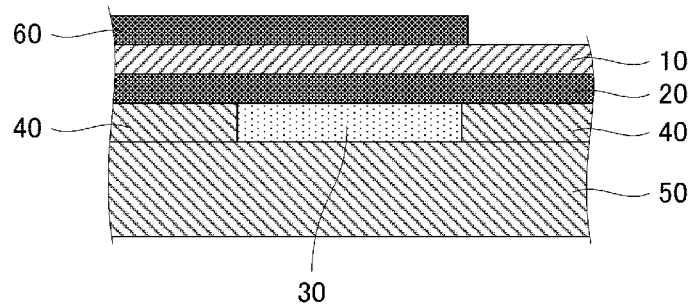
FIGS. 1A and 1B are views schematically illustrating a method for manufacturing an existing piezoelectric device.
Figure 1B:
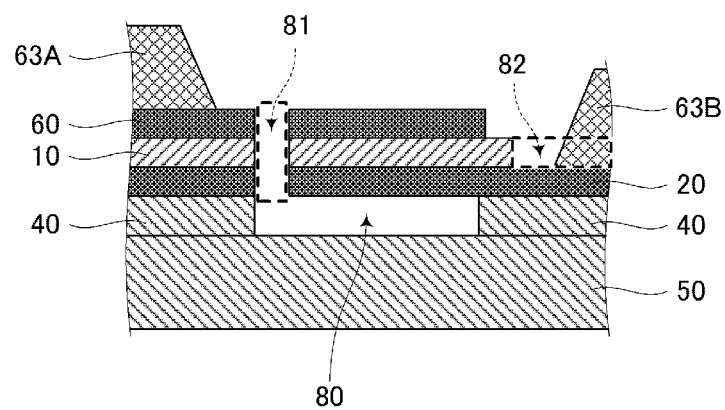
Figure 2:
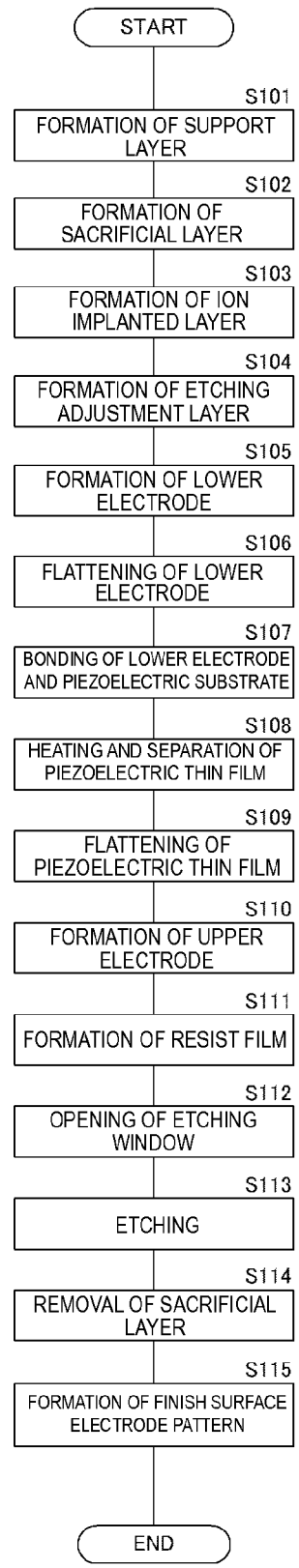
FIG. 2 is a flow chart illustrating a method for manufacturing a piezoelectric device according to a first preferred embodiment of the present invention.

FIG. 2 is a flow chart illustrating a method for manufacturing a piezoelectric device according to a first preferred embodiment of the present invention. FIGS. 3A to 7B are drawings schematically illustrating a method for manufacturing the piezoelectric device according to the first preferred embodiment of the present invention.

Figure 3A:
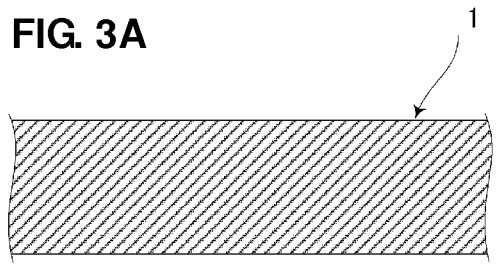
FIGS. 3A and 3B are views schematically illustrating a method for manufacturing the piezoelectric device illustrated in FIG. 2.
Figure 3B:
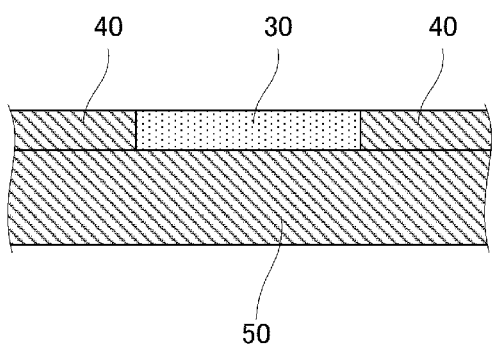

First, as illustrated in FIGS. 3A and 3B, a piezoelectric single crystal substrate 1 having a predetermined thickness and a support substrate 50 having a predetermined thickness are prepared. As the piezoelectric single crystal substrate 1, a lithium tantalate substrate is utilized. As the support substrate 50, a lithium niobate substrate is utilized. In this case, as the support substrate 50, a substrate in a wafer level on which a plurality of thin film piezoelectric devices is provided is preferably used. As the piezoelectric single crystal substrate 1, a lithium tetraborate substrate, a langasite substrate, a potassium niobate substrate, or a potassium lithium niobate substrate may be used in addition to the lithium niobate substrate, for example. As the support substrate 50, ceramics, such as Si and glass, crystal, sapphire, or the like may be used, for example.

As illustrated in FIG. 3B, a support layer 40 having a predetermined thickness is formed on the surface of the support substrate 50 (FIG. 2: S101). The support layer 40 is not limited insofar as the support layer contains an insulation material, includes inorganic materials, such as a silicon oxide, a silicon nitride, an aluminum oxide, and PSG, and organic materials, such as resin, and has strong resistance to etching gas or an etchant for removal of the sacrificial layer 30. The support layer 40 is formed in a certain region (region excluding the region where the sacrificial layer 30 is formed) of the surface of the support substrate 50 by vapor deposition, sputtering, CVD, spin coating, or other suitable process, for example. More specifically, the support layer 40 is formed directly under a non-vibration region where the piezoelectric thin film 10 does not function as a piezoelectric device. The thickness of the support layer 40 is determined in accordance with the depth of a cavity 80 constituting a hollow region of a membrane. Herein, the portion containing the support layer 40 and the support substrate 50 is equivalent to the "support member" according to a preferred embodiment of the present invention.

It is more preferable to determine the material of the support layer 40 considering the coefficient of linear expansion relative to the piezoelectric single crystal substrate 1 or the sacrificial layer 30.

Next, as illustrated in FIG. 3B, the sacrificial layer 30 having a predetermined thickness is formed on the surface of the support substrate 50 (FIG. 2: S102). The sacrificial layer is preferably made of a material that is capable of using etching gas or etchant which have an etching rate that is different from that of the lower electrode 20. The sacrificial layer 30 is preferably made of a material which is more easily etched than the upper electrode 60, the piezoelectric thin film 10, the lower electrode 20, the support layer 40, the support substrate 50, and the etching adjustment layer 90. Specifically, the material is selected as appropriate from metals, such as Ni, Cu, and Al, insulation films of $SiO_2$, ZnO, PSG (phosphosilicate glass), or the like organic films, and the like in accordance with the conditions. The sacrificial layer 30 is preferably formed with the same thickness as that of the support layer 40 in a space (i.e., space directly under the vibration region where the piezoelectric thin film 10 functions as a piezoelectric device and the hole portion 81) serving as the cavity 80 on the surface of the support substrate 50 by vapor deposition, sputtering, CVD, spin coating, or other suitable process.

Figure 4A:
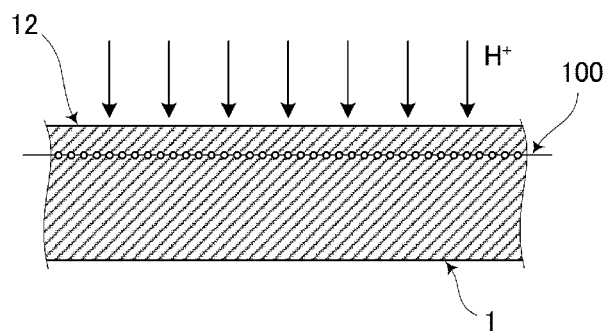
FIGS. 4A and 4B are views schematically illustrating the method for manufacturing the piezoelectric device illustrated in FIG. 2.

Next, as illustrated in FIG. 4A, an ion implantation layer 100 is formed in the piezoelectric single crystal substrate 1 by implanting hydrogen ions from the side of a rear surface 12 of the piezoelectric single crystal substrate 1 (FIG. 2: S103). For example, when a lithium tantalate substrate is used for the piezoelectric single crystal substrate 1, a hydrogen ion layer (portion where hydrogen ions are distributed) is formed at a depth of about 1 μm from the rear surface 12 by implanting hydrogen ions with a dose amount of about $9.0 \times 10^{16}$ atom/cm$^2$ at an acceleration energy of about 150 KeV, for example, such that the ion implantation layer 100 is formed. The depth profile is determined by the ion implantation energy. Therefore, the ion implantation layer 100 can be formed at a desired depth. The ion implantation layer 100 is a layer in the piezoelectric single crystal substrate 1, where the concentration of the implanted ions achieves a maximum value.

When substrates other than the lithium tantalate substrate are used for the piezoelectric single crystal substrate 1, ion implantation is performed under the conditions in accordance with each substrate.

Figure 4B:
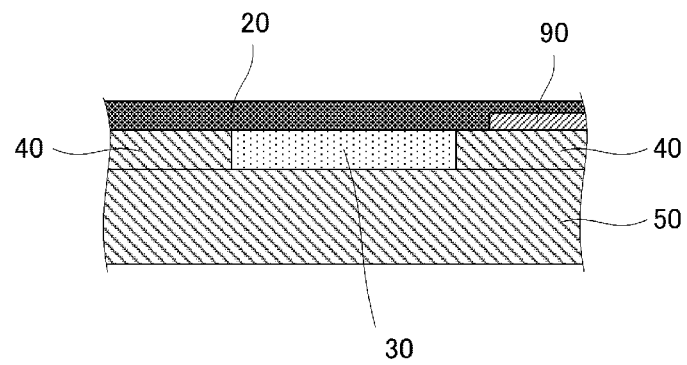

As illustrated in FIG. 4B, an etching adjustment layer is formed on the surface of the support layer 40 formed on the support substrate 50 (FIG. 2: S104). The etching adjustment layer 90 is a layer which adjusts the progress of etching.

When S104 is described in more detail, the etching adjustment layer 90 is preferably selected from conductive materials whose etching rate is lower than that of the lower electrode 20 in accordance with the conditions. Specifically, it is preferable to select a metal material containing any of Al, Cu, Ni, Cr, and Pt, for example. Al and Cu are materials having a low fluorine plasma etching rate and high conductivity and Ni, Cr, and Pt are materials whose etching rate is lower than that of Al and Cu. The etching adjustment layer 90 is formed with a predetermined thickness in a specific region (region where a wiring line 63B described later is to be formed) on the surface of the support layer 40 by vapor deposition, sputtering, CVD, or other suitable process.

After forming the etching adjustment layer 90, a lower electrode 20 having a predetermined thickness is formed using Al (aluminum) or the like on the surface of the etching adjustment layer 90, the sacrificial layer 30, and the support layer 40 (FIG. 2: S105). Therefore, the etching adjustment layer 90 is positioned at the support member side of the lower electrode 20.

For the lower electrode 20, not only Al but W, Mo, Ta, Hf, Cu, Pt, Ti, and the like may be used alone or in combination in accordance with the specification of the device.

As illustrated in FIG. 4B, the surface of the lower electrode 20 is planarized by CMP or the like with a polishing amount such that the etching adjustment layer 90 is not exposed (FIG. 2: S106).

Figure 5A:
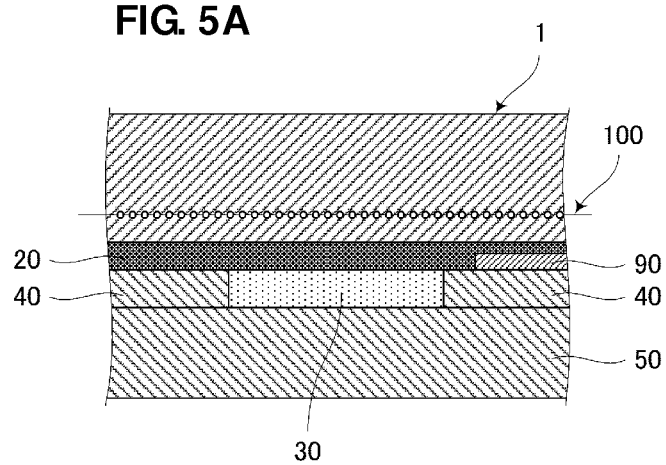
FIGS. 5A to 5C are views schematically illustrating the method for manufacturing the piezoelectric device illustrated in FIG. 2.

Next, as illustrated in FIG. 5A, the lower electrode 20 on the support substrate 50 and the rear surface 12 of the piezoelectric single crystal substrate 1 are bonded to each other (FIG. 2: S107).

For the bonding, direct bonding by activated bonding may be used, for example. The direct bonding is a bonding method in which bonding is performed in a state where the surface to be bonded is activated by irradiating Ar ion beam or the like in a vacuum at room temperature and which does not need heating. By using such a method, heat treatment for eliminating hydrogen is not required after bonding, such as hydrophilic bonding, and degradation of the characteristics of the piezoelectric device due to heating and the generation of stress due to a difference in the coefficient of linear expansion between the piezoelectric single crystal substrate 1 and the support substrate 50 can be prevented.

Figure 5B:
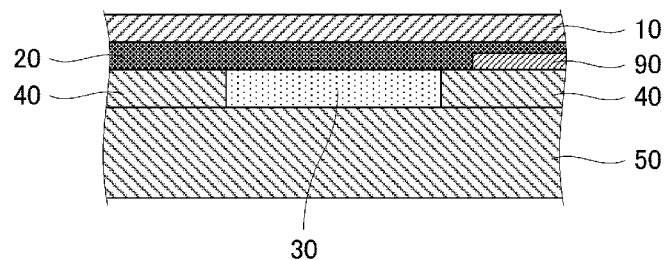

Next, the piezoelectric single crystal substrate 1 is heated (for example, at about 500° C. in this preferred embodiment), and then separation is performed at the ion implantation layer 100 as the separation plane (FIG. 2: S108). Thus, as illustrated in FIG. 5B, a single crystal piezoelectric thin film 10 is formed on the surface of the lower electrode 20 above the support substrate 50. By using the piezoelectric thin film 10 that is a single crystal thin film, a thin film can be formed whose piezoelectricity is more excellent than that of a polycrystalline film formed by sputtering, vapor deposition, a CVD method, or other suitable process. The crystal orientation of the piezoelectric single crystal substrate 1 is the crystal orientation of the piezoelectric thin film 10. Therefore, by preparing the piezoelectric single crystal substrate 1 having a crystal orientation in accordance with the characteristics of the piezoelectric device, the piezoelectric thin film 10 having a crystal orientation in accordance with the characteristics can be formed. Since the single crystal thin films are formed from one piezoelectric single crystal substrate by repeating an ion implantation process, a bonding process, and a separation process, a plurality of the piezoelectric thin films 10 can be formed from one piezoelectric single crystal substrate 1. Therefore, a loss of a single crystal piezoelectric material can be significantly reduced.

In S108 above, when heated under a reduced pressure, the heating temperature can be lowered.

Then, the surface of the piezoelectric thin film 10 thus obtained by separation and formation is planarized by CMP treatment or the like (FIG. 2: S109).

In this preferred embodiment, the piezoelectric thin film 10 is formed by ion implantation, bonding, and separation, but the piezoelectric thin film 10 may be formed by sputtering, vapor deposition, CVD, or the like.

Figure 5C:
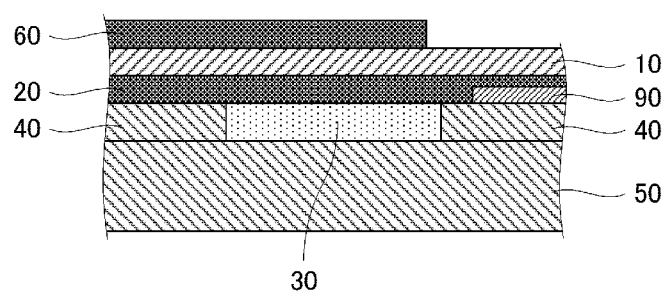

Next, as illustrated in FIG. 5C, the upper electrode 60 having a predetermined thickness is formed on the surface of the piezoelectric thin film 10 using Al (aluminum) or the like (FIG. 2: S110).

The predetermined thickness is preferably equal to the thickness of the lower electrode 20. For the upper electrode 60, in addition to Al, W, Mo, Ta, Hf, Cu, Pt, Ti, and the like may be used alone or in combination in accordance with the specification of the device.

Next, as illustrated in FIG. 6A, a resist film 70 is applied on the surface of the piezoelectric thin film 10 on which the upper electrode 60 is formed (FIG. 2: S111). Then, an etching window 71 for forming a through hole 81 which is formed through the upper electrode 60, the piezoelectric thin film 10, and the lower electrode 20 and an etching window 72 for exposing the etching adjustment layer 90 which is conductive with the lower electrode 20, are formed in the resist film 70 using a photolithography technique (FIG. 2: S112).

Next, by making etching gas or an etchant flow through the etching windows 71 and 72, the through hole 81, through which a portion of the sacrificial layer 30 is exposed to the side of the piezoelectric thin film 10, and the opening portion 82, through which the etching adjustment layer 90, which is conductive with the lower electrode 20, is exposed to the side of the piezoelectric thin film 10, are simultaneously formed (FIG. 2: S113). In the formation of the through hole 81 and the opening portion 82 in S113, an etching depth of the opening portion 82 is shorter than that of the through hole 81. The etching rate of the piezoelectric thin film 10, which is obtained by forming an ion implantation layer 100 and then by bonding and separating the ion implantation layer 100, is not uniform over the entire piezoelectric thin film 10 due to damage caused by the ion implantation, and varies in some portions of the piezoelectric thin film 10. However, since the etching adjustment layer 90 contains a material whose etching rate is lower than that of the lower electrode 20, the etching rate of the etching adjustment layer 90 is lower than that of the lower electrode 20. Therefore, when the formation of the through hole and the formation of the opening portion 82 are simultaneously carried out, the etching adjustment layer 90 remains and is exposed when the required etching time for the formation of the through hole 81 has passed. Since the etching adjustment layer 90 is a conductive material and is conductive with the lower electrode 20, the etching adjustment layer 90 functions as a lower electrode.

Then, by making etching gas or an etchant flow through the through hole 81, the sacrificial layer 30 is removed (FIG. 2: S114). Thereafter, the resist film 70 is removed. In the etching of S114, the space where the sacrificial layer 30 was formed becomes the cavity 80 as illustrated in FIG. 6B.

The etching gas or the etchant to be used in S114 is etching gas or an etchant selected in accordance with the sacrificial layer 30, and the type thereof is different from that in S113.

Figure 7A:
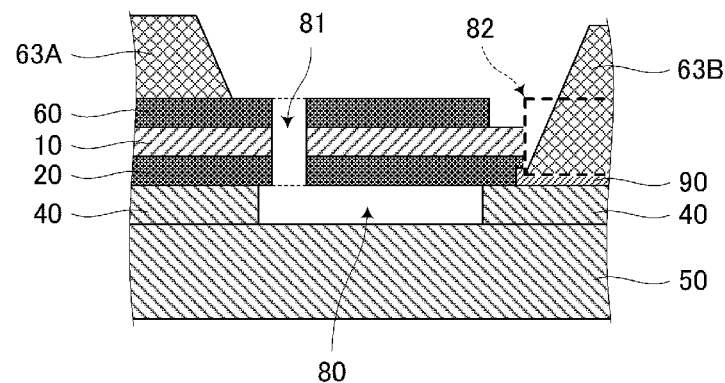
FIGS. 7A and 7B are views schematically illustrating the method for manufacturing the piezoelectric device illustrated in FIG. 2.
Figure 7B:
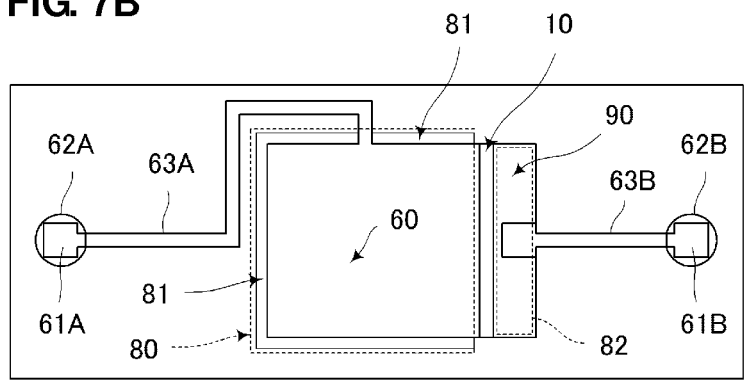

Next, as illustrated in FIGS. 7A and 7B, a finish surface electrode pattern is formed (FIG. 2: S115). When described in detail, a lead-out wiring 63A is formed between the upper electrode 60 and a bump pad 61A and a lead-out wiring 63B is formed between the conductive etching adjustment layer 90, which is conductive with the lower electrode 20, and a bump pad 61B. Then, bumps 62A and 62B are formed on both the bump pads 61A and 61B.

The lower electrode 20 and the etching adjustment layer 90 are equivalent to the "first electrode" according to a preferred embodiment of the present invention. The etching adjustment layer 90 is equivalent to the "etching adjustment layer" according to a preferred embodiment of the present invention.

Finally, after a dividing process, which divides a substrate in wafer level into the plurality of thin film piezoelectric devices formed on the support substrate 50, a packaging process using a mold die is performed. Thus, a thin film piezoelectric device is formed. Therefore, a plurality of thin film piezoelectric devices can be manufactured at one time.

By the use of the piezoelectric device having the structure obtained by the above-described manufacturing method and illustrated in FIGS. 7A and 7B, the sacrificial layer exposure process and the lower electrode exposure process which have been discretely performed in an existing manufacturing method can be simultaneously performed. More specifically, since the etching process is preferably performed only once, damage to the piezoelectric thin film 10 caused by etching can be reduced. Moreover, even when dry etching is used in the exposure process in S113 above, polarization degradation in the piezoelectric thin film 10 is significantly reduced and prevented.

Moreover, since the time required for the etching process including the resist film applying step, the photolithography step, the etching step, and the like is reduced to about half, the manufacturing cost can be reduced. In particular, when the piezoelectric thin film 10 is formed with a material which is difficult to be etched, such as lithium tantalate or lithium niobate, the time required for the etching process becomes long. Therefore, the manufacturing cost can be significantly reduced.

Therefore, according to the piezoelectric device of the present preferred embodiment and the method for manufacturing the piezoelectric device, damage to the piezoelectric thin film 10 caused by etching can be reduced and also the manufacturing cost of the thin film piezoelectric device can be reduced.

Moreover, since a plurality of thin film piezoelectric devices can be manufactured at the same time, the manufacturing cost of the thin film piezoelectric device can be significantly reduced.

Next, a method for manufacturing a piezoelectric device according to a second preferred embodiment is described with reference to the drawings.

Figure 8:
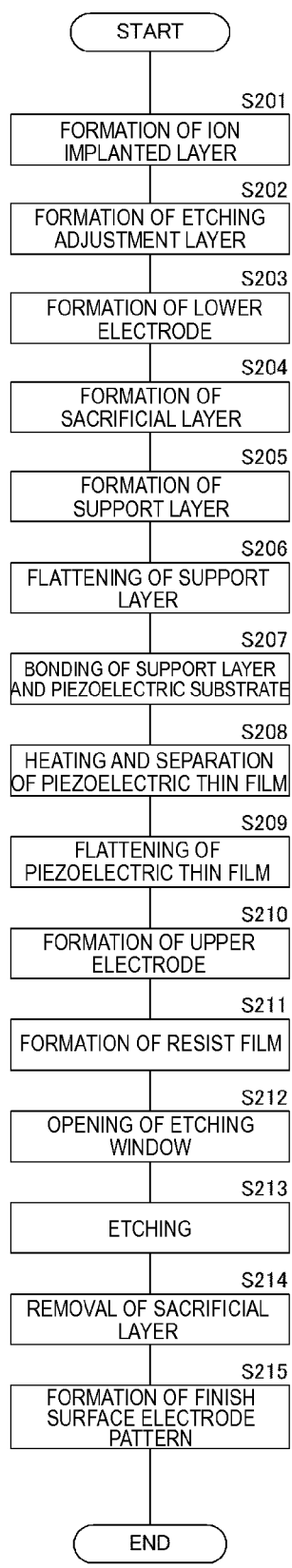
FIG. 8 is a flow chart illustrating a method for manufacturing a piezoelectric device according to a second preferred embodiment of the present invention.

FIG. 8 is a flow chart illustrating a method for manufacturing the piezoelectric device according to the second preferred embodiment of the present invention. FIGS. 9A to 11B are drawings schematically illustrating the method for manufacturing the piezoelectric device according to the second preferred embodiment.

The method for manufacturing the piezoelectric device according to the present preferred embodiment is different from the method for manufacturing the piezoelectric device described in the first preferred embodiment in the formation methods of the etching adjustment layer, the lower electrode, the sacrificial layer, and the support layer and the bonding method of the support substrate and the piezoelectric substrate. Therefore, S202 to S207 of FIG. 8 corresponding to the processes are described in detail below. S201 and S208 to S215 of FIG. 8 are the same as S103 and S108 to S115 illustrated in the first preferred embodiment, respectively. Therefore, with respect to S208 to S215 of FIG. 8, only different points of S202 to S207 of FIG. 8 are described in detail.

Figure 9A:
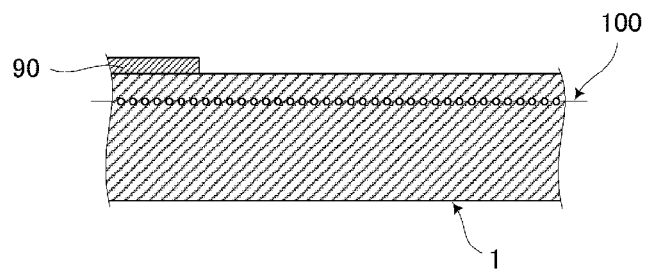
FIGS. 9A to 9C are views schematically illustrating a method for manufacturing the piezoelectric device illustrated in FIG. 8.

As illustrated in FIG. 9A, the etching adjustment layer 90 is formed on the surface of the piezoelectric single crystal substrate 1 (FIG. 8: S202).

The material and the formation method of the etching adjustment layer 90 are preferably the same as those of the first preferred embodiment.

Figure 9B:
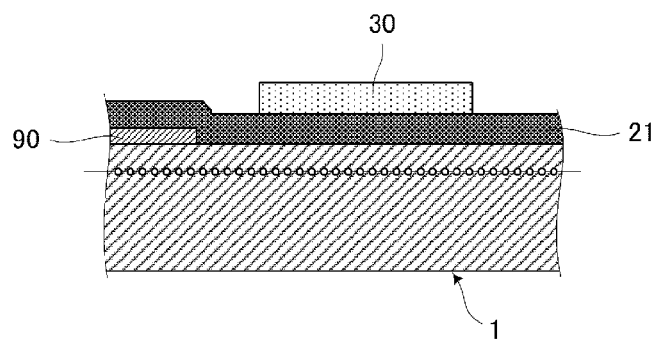

Next, as illustrated in FIG. 9B, a lower electrode 21 is formed on the surface of the piezoelectric single crystal substrate 1 on which the etching adjustment layer 90 is formed (FIG. 8: S203). Therefore, the etching adjustment layer 90 is formed between the piezoelectric thin film 10 and the lower electrode 21.

The material and the formation method of the lower electrode 21 are preferably the same as those the lower electrode 20 of the first preferred embodiment.

Next, the sacrificial layer 30 is formed on the surface of the lower electrode 21 (FIG. 8: S204).

The material and the formation method of the sacrificial layer 30 are also preferably the same as those of the first preferred embodiment.

Figure 9C:
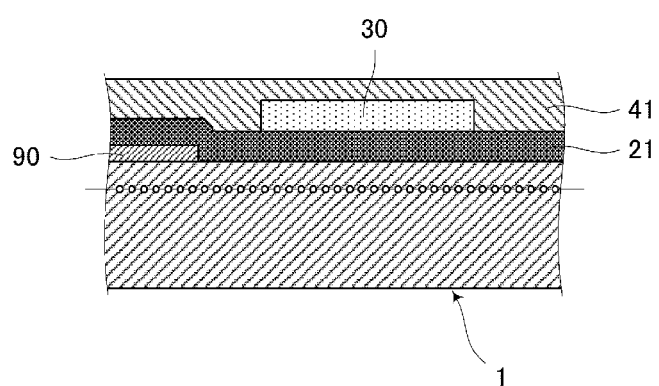

Next, as illustrated in FIG. 9C, a support layer 41 is formed on the surface of the lower electrode 21 that has the sacrificial layer 30 thereon, in such a manner that the support layer 41 covers the sacrificial layer 30 (FIG. 8: S205). Then, the surface of the support layer 41 is planarized by CMP or the like with a polishing amount such that the sacrificial layer 30 is not exposed (FIG. 8: S206).

The material and the formation method of the support layer 41 are the same as those of the support layer 40 of the first preferred embodiment.

Figure 10A:
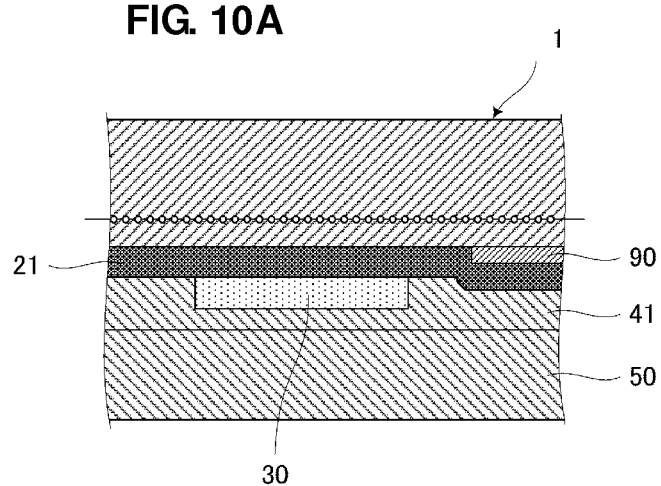
FIGS. 10A and 10B are views schematically illustrating the method for manufacturing the piezoelectric device illustrated in FIG. 8.

Next, as illustrated in FIG. 10A, the surface of the support layer 41 and the support substrate 50 are bonded to each other (FIG. 8: S207). The bonding method is also preferably the same as that of the first preferred embodiment.

Figure 10B:
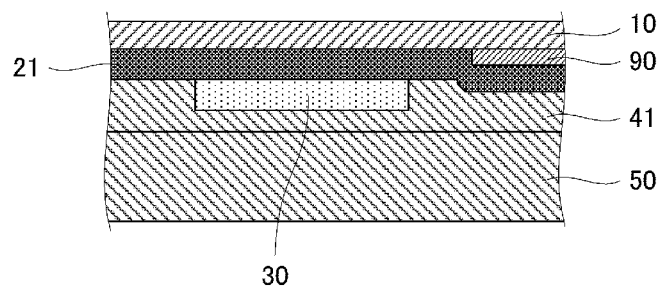

Next, when separation at the ion implantation layer 100 as the separation plane is performed (FIG. 8: S208), a piezoelectric thin film 10 is formed on the surface of the lower electrode 21 that is formed over the support substrate 50 as illustrated in FIG. 10B.

Figure 11A:
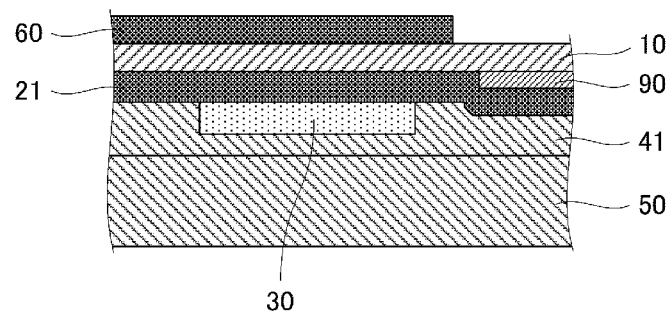
FIGS. 11A and 11B are views schematically illustrating the method for manufacturing the piezoelectric device illustrated in FIG. 8.

Next, after planarization (FIG. 8: S209), the upper electrode 60 is formed on the surface of the piezoelectric thin film 10 as illustrated in FIG. 11A (FIG. 8: S210).

Next, after S211 to S212 of FIG. 8, the through hole 81, through which a portion of the sacrificial layer 30 is exposed to the side of the piezoelectric thin film 10, and the opening portion 82, which exposes the piezoelectric thin film 10 and the etching adjustment layer 90, which is conductive with the lower electrode 21, to the side of the piezoelectric thin film 10, are simultaneously formed (FIG. 8: S213). In S213, the etching adjustment layer 90 is formed between the piezoelectric thin film 10 and the lower electrode 21. Therefore, in the formation of the opening portion 82, the piezoelectric thin film is etched before the etching adjustment layer 90 and the etching adjustment layer 90 is etched before the lower electrode 21. In this case, the etching rate is adjusted according to the etching adjustment layer 90, so that the etching adjustment layer 90 remains and is exposed after the etching time required for the formation of the through hole 81 has passed.

Figure 11B:
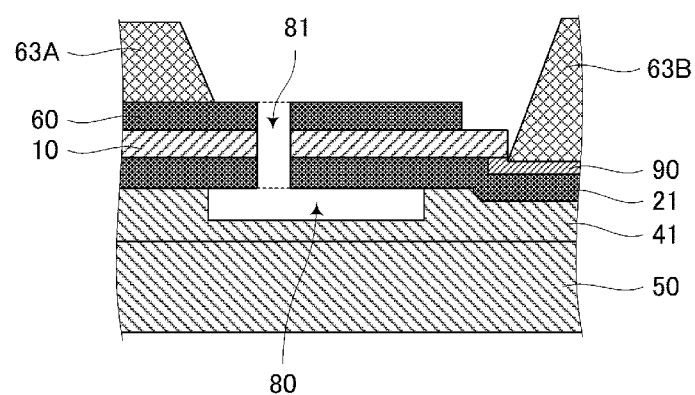

Then, after removing the sacrificial layer 30 in S214 of FIG. 8, a finish surface electrode pattern is formed as illustrated in FIG. 11B (FIG. 8: S215). When described in detail, the lead-out wiring 63A is formed between the upper electrode 60 and the bump pad 61A and also the lead-out wiring 63B is formed between the conductive etching adjustment layer 90, which is conductive with the piezoelectric thin film 10 and the lower electrode 21, and the bump pad 61B. The bumps 62A and 62B are formed on both the bump pads 61A and 61B (FIG. 7B). Thereafter, the process progresses to the dividing process and the packaging process described in the first preferred embodiment, so that a thin film piezoelectric device is formed.

The lower electrode 21 and the etching adjustment layer 90 are equivalent to the "first electrode" according to a preferred embodiment of the present invention. The etching adjustment layer 90 is equivalent to the "etching adjustment layer" according to a preferred embodiment of the present invention.

By the use of the piezoelectric device having the structure obtained by the above-described manufacturing method and illustrated in FIGS. 7B and 11B, the sacrificial layer exposure process and the lower electrode exposure process which have been discretely performed in an existing manufacturing method can be simultaneously performed. More specifically, since the etching process is preferably performed only once, the same effects as those of the first preferred embodiment are achieved according to the piezoelectric device and the method for manufacturing the piezoelectric device of this preferred embodiment.

Next, a method for manufacturing a piezoelectric device according to a third preferred embodiment of the present invention is described with reference to the drawings.

Figure 12:
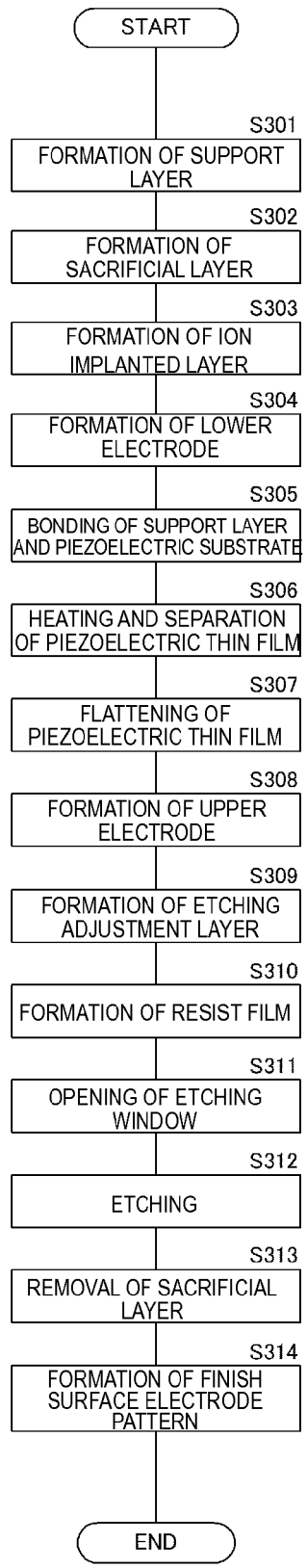
FIG. 12 is a flow chart illustrating a method for manufacturing a piezoelectric device according to a third preferred embodiment of the present invention.
Figure 13A:
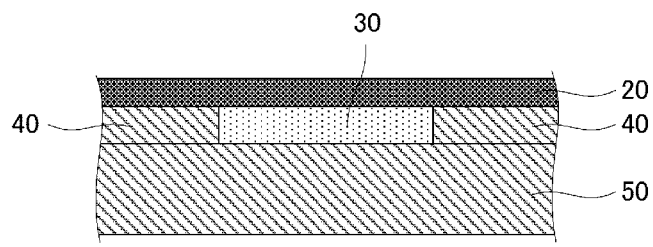
FIGS. 13A to 13D are views schematically illustrating a method for manufacturing the piezoelectric device illustrated in FIG. 12.
Figure 13B:
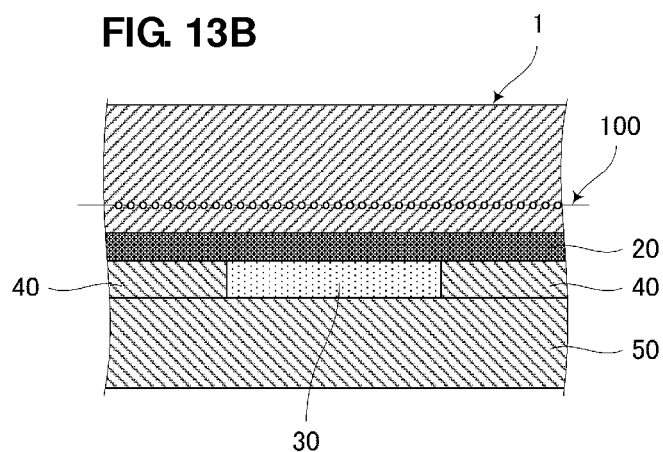
Figure 13C:
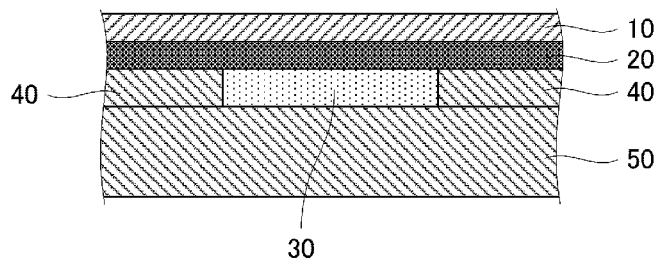
Figure 13D:
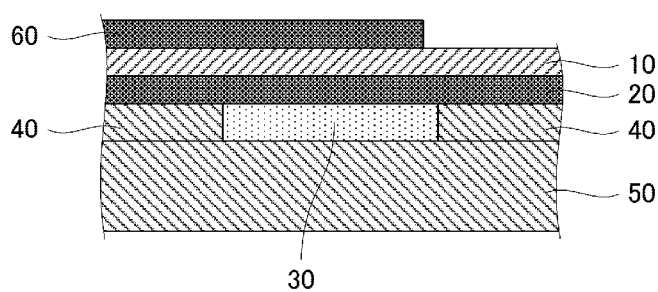

FIG. 12 is a flow chart illustrating the method for manufacturing the piezoelectric device according to the third preferred embodiment of the present invention. FIGS. 13A to 14B are drawings schematically illustrating the method for manufacturing the piezoelectric device according to the third preferred embodiment.

The method for manufacturing the piezoelectric device according to the present preferred embodiment is different from the method for manufacturing the piezoelectric device described in the first preferred embodiment in the formation order of the etching adjustment layer. Therefore, S304 to S309 of FIG. 12 corresponding to the processes are described in detail below.

S301 to S303 and S310 to S314 of FIG. 12 are preferably the same as S101 to S103 and S111 to S115, respectively, illustrated in the first preferred embodiment. Therefore, with respect to S310 to S314 of FIG. 12, only different points of S304 to S309 of FIG. 8 are described in detail.

In the method for manufacturing the piezoelectric device of this preferred embodiment, the process progresses to the following process without forming the etching adjustment layer 91 in S104 of FIG. 2. More specifically, the formation of the lower electrode 20 illustrated in FIG. 13A (FIG. 12: S304), the bonding of the lower electrode 20 and the piezoelectric single crystal substrate 1 illustrated in FIG. 13B (FIG. 12: S305), the formation of the piezoelectric thin film 10 illustrated in FIG. 13C (FIG. 12: S306, S307), and the formation of the upper electrode 60 illustrated in FIG. 13D (FIG. 12: S308) are performed before the formation of the etching adjustment layer 91.

Figure 14A:
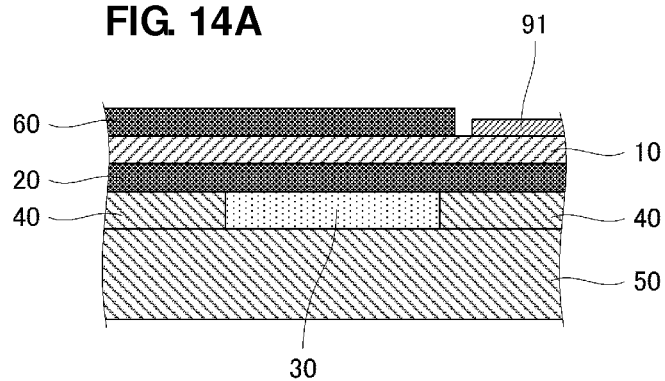
FIGS. 14A and 14B are views schematically illustrating the method for manufacturing the piezoelectric device illustrated in FIG. 12.

Thereafter, as illustrated in FIG. 14A, the etching adjustment layer 91 which satisfies the equation of "A/α+B/β=C/γ" is formed on the surface of the piezoelectric thin film 10 (FIG. 12: S309). A is the value indicating the thickness of the lower electrode 20, B is the value indicating the thickness of the upper electrode 60, and C is the value indicating the thickness of the etching adjustment layer 91. α is the value indicating the etching rate of the lower electrode 20, β is the value indicating the etching rate of the upper electrode 60, and γ is the value indicating the etching rate of the etching adjustment layer 91. Therefore, in this preferred embodiment, the etching adjustment layer 91 is formed on the surface of the piezoelectric thin film 10.

When S309 above is described detail, the etching adjustment layer 91 is formed with a material and a thickness with which the etching time required for the formation of the through hole 81 and the etching time required for the formation of the opening portion 82 are equal to each other. For example, when the material and the thickness of the lower electrode 20 are tungsten and about 1 μm, respectively, and the material and the thickness of the upper electrode 60 are aluminum and about 0.5 μm, respectively, the etching adjustment layer 91 is a multilayer film and the material and the thickness thereof are tungsten and about 1 μm, respectively, and Al and about 0.5 μm, respectively.

The formation method of the etching adjustment layer is preferably the same as that of the etching adjustment layer 90 of the first preferred embodiment. However, since the etching adjustment layer 91 is not used as a lower electrode, the material of the etching adjustment layer 91 may not be a conductive material and materials (e.g., organic materials, such as resin) other than metal materials may be acceptable. Since the etching adjustment layer 91 is formed in S309 after the formation of the upper electrode 60 in S308, the thickness of the etching adjustment layer 91 can also be freely finely changed.

Next, after S310 and S311 of FIG. 12, the through hole 81, through which a portion of the sacrificial layer 30 is exposed to the side of the piezoelectric thin film 10, and the opening portion 82, through which the lower electrode 20 is exposed to the side of the piezoelectric thin film 10, are simultaneously formed by etching the piezoelectric thin film 10, the etching adjustment layer 91, and the like (FIG. 12: S312). In S312, the etching adjustment layer 91 is etched before the piezoelectric thin film 10 in the formation of the opening portion 82. In this case, the etching rate is adjusted according to the etching adjustment layer 91, so that the lower electrode remains and is exposed after the etching time required for the formation of the through hole 81 has passed.

Figure 14B:
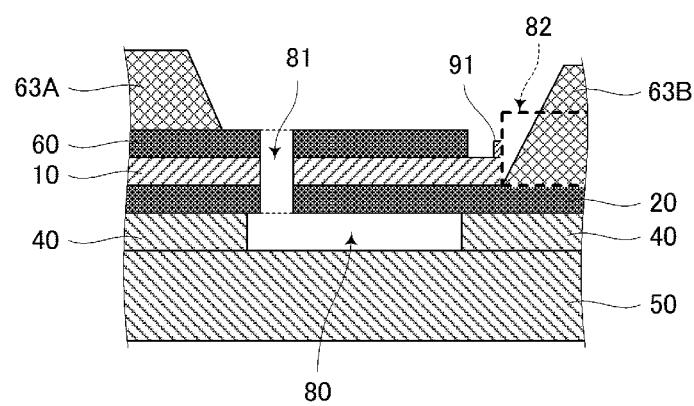

Then, the sacrificial layer 30 is removed in S313 of FIG. 12. Thereafter, a finish surface electrode pattern is formed as illustrated in FIG. 14B (FIG. 12: S314). When described in detail, the lead-out wiring 63A is formed between the upper electrode 60 and the bump pad 61A and also the lead-out wiring 63B is formed between the lower electrode 20 and the bump pad 61B. The bumps 62A and 62B are formed on both the bump pads 61A and 61B (FIG. 7B). Thereafter, the process progresses to the dividing process and the packaging process described in the first preferred embodiment, so that a thin film piezoelectric device is formed.

The lower electrode 20 is equivalent to the "first electrode" according to a preferred embodiment of the present invention. The etching adjustment layer 90 is equivalent to the "etching adjustment layer" according to a preferred embodiment of the present invention.

By the use of the above-described manufacturing method, the sacrificial layer exposure process and the lower electrode exposure process which have been discretely performed in an existing manufacturing method can be simultaneously performed also in the present preferred embodiment. More specifically, since the etching process is performed only one, the same effects as those of the method for manufacturing the piezoelectric device of the first preferred embodiment are demonstrated according to the method for manufacturing the piezoelectric device of this preferred embodiment.

Next, a method for manufacturing a plate wave device according to a fourth preferred embodiment of the present invention is described with reference to the drawings.

Figure 15A:
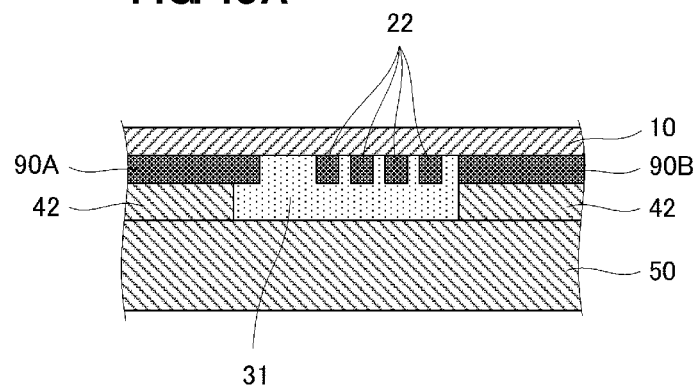
FIGS. 15A and 15B are views schematically illustrating a method for manufacturing a plate wave device according to a fourth preferred embodiment of the present invention.
Figure 15B:
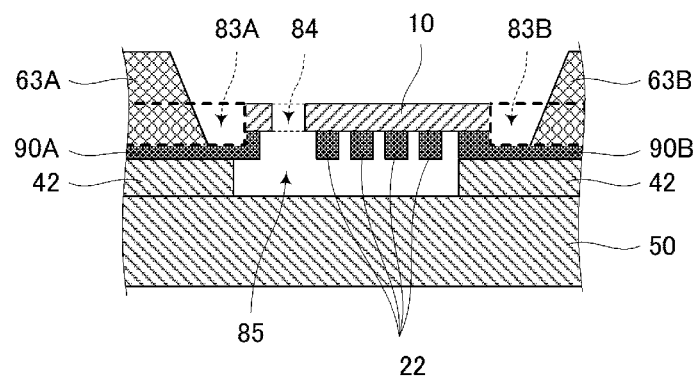

FIGS. 15A and 15B are views schematically illustrating the method for manufacturing the plate wave device according to the fourth preferred embodiment of the present invention.

The method for manufacturing the piezoelectric device of the present preferred embodiment is different from the method for manufacturing the piezoelectric device described in the second preferred embodiment in the formation pattern of the lower electrode, the thickness of the support layer, and the thickness of the sacrificial layer and particularly in the position where the etching adjustment layer is formed.

First, the etching adjustment layer 90 is formed on the surface of the piezoelectric single crystal substrate 1 on which the ion implantation layer 100 is formed, and a comb-shaped electrode 22 is formed on the surface of piezoelectric single crystal substrate 1. Then a sacrificial layer 31 to be a cavity 85 is formed on the surface of the piezoelectric single crystal substrate 1, and a support layer 42 is formed on the surface of the etching adjustment layer 90. Finally, a support substrate 50 and the support layer 42 and the sacrificial layer 31 are bonded, and then the piezoelectric thin film 10 is formed by separation. The cross section of the above piezoelectric device is illustrated in FIG. 15A.

Herein, the etching rate of the piezoelectric thin film 10, which is obtained by forming an ion implantation layer 100 and then by bonding and separating the ion implantation layer 100, is not uniform over the entire piezoelectric thin film 10 due to damage caused by the ion implantation, and varies in some portions of the piezoelectric thin film 10. Therefore, in a case where a lower electrode is formed in place of etching adjustment layers 90A and 90B, when the sacrificial layer exposure process and the lower electrode exposure process are simultaneously performed, the lower electrode may be removed in some cases during the etching time required for the formation of the through hole 84. Accordingly, in the manufacturing method of the present preferred embodiment, the conductive etching adjustment layers 90A and 90B are formed in place of the lower electrode at the rear surface side of the piezoelectric thin film 10.

Then, a through hole 84, through which a portion of the sacrificial layer 31 is exposed to the side of the piezoelectric thin film 10 and opening portions 83A and 83B which the piezoelectric thin film 10 and the etching adjustment layers 90A and 90B, which are conductive with the comb-shaped electrode 22, are exposed to the side of the piezoelectric thin film 10, are simultaneously formed. In the present preferred embodiment, the piezoelectric thin film 10 is etched before the etching adjustment layers 90A and 90B in the formation of the opening portions 83A and 83B. In this case, the etching rate is adjusted according to the etching adjustment layers 90A and 90B, so that the etching adjustment layers 90A and 90B remain and are exposed after the etching time required for the formation of the through hole 84 has passed.

Next, the sacrificial layer 31 is removed through the through hole 84, and the cross section is illustrated in FIG. 15B.

Next, the lead-out wiring 63A is formed between the conductive etching adjustment layer 90A in contact with the piezoelectric thin film 10 and the bump pad 61A and also the lead-out wiring 63B is formed between the conductive etching adjustment layer 90B in contact with the piezoelectric thin film 10 and the bump pad 61B. The bumps 62A and 62B are formed on both the bump pads 61A and 61B (FIG. 7B).

The comb-shaped electrodes 22 and the etching adjustment layers 90A and 90B are equivalent to the "first electrode" according to a preferred embodiment of the present invention. The etching adjustment layers 90A and 90B are equivalent to the "etching adjustment layer" according to a preferred embodiment of the present invention.

Finally, after a dividing process, which divides a substrate in wafer level into a plurality of plate wave devices formed on the support substrate 50, a packaging process using a mold die is performed. Thus, the plate wave device is formed.

By the use of the piezoelectric device having the structure obtained by the above-described manufacturing method and illustrated in FIGS. 7B and 15B, the sacrificial layer exposure process and the lower electrode exposure process which have been discretely performed in an existing manufacturing method can be simultaneously performed also in the present preferred embodiment. More specifically, since the etching process is preferably performed just once, the same effects as those of the second preferred embodiment are achieved according to the piezoelectric device and the method for manufacturing the piezoelectric device of this preferred embodiment.

Although, in the above-described preferred embodiments, the description is provided with reference to a piezoelectric device for F-BAR and a plate wave device as an example, the manufacturing method of preferred embodiments of the present invention can also be applied to various devices containing a piezoelectric single crystal thin film and including a membrane, such as a gyroscope, an RF switch, an oscillating power generation element, and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a piezoelectric device including a piezoelectric thin film, a support member bonded to a rear surface of the piezoelectric thin film, a first electrode formed on the rear surface of the piezoelectric thin film, and a cavity formed at a support member side of the first electrode between the piezoelectric thin film and the support member, the method comprising the steps of:
   a sacrificial layer formation step of forming a sacrificial layer in an area to be the cavity;
   an adjustment layer formation step of forming an etching adjustment layer which adjusts progress of etching in a region where the first electrode is exposed to a side of the piezoelectric thin film;
   an exposure step of simultaneously forming a through hole through which a portion of the sacrificial layer is exposed to the side of the piezoelectric thin film and an opening portion which the first electrode is exposed to a side of the piezoelectric thin film by etching the piezoelectric thin film and the etching adjustment layer; and
   a sacrificial layer removal step of removing the sacrificial layer through the through hole; wherein
   in the adjustment layer formation step, the etching adjustment layer is formed at the rear surface of the piezoelectric thin film and between the piezoelectric thin film and the first electrode.

2. The method for manufacturing a piezoelectric device according to claim 1, further comprising:
   an ion implantation step of forming an ion implantation layer by implanting ions into a piezoelectric single crystal substrate;
   a bonding step of bonding the piezoelectric single crystal substrate, on which the ion implantation layer is formed, to the support member; and
   a separation and formation step of separating the piezoelectric thin film in the form of a single crystal from the piezoelectric single crystal substrate and forming the single crystal piezoelectric thin film on a surface of the first electrode.

3. The method for manufacturing a piezoelectric device according to claim 1, wherein the material of the piezoelectric thin film is lithium tantalate or lithium niobate.

4. The method for manufacturing a piezoelectric device according to claim 1, wherein, in the adjustment layer formation step, the first electrode is formed on the etching adjustment layer.

5. The method for manufacturing a piezoelectric device according to claim 1, wherein, in the adjustment layer formation step, the etching adjustment layer is formed with a conductive material.

6. The method for manufacturing a piezoelectric device according to claim 1, wherein, in the adjustment layer formation step, the etching adjustment layer is formed with a material whose etching rate is lower than that of the first electrode.

7. The method for manufacturing a piezoelectric device according to claim 1, wherein, in the adjustment layer formation step, the etching adjustment layer is formed with a metal material.

8. The method for manufacturing a piezoelectric device according to claim 7, wherein, in the adjustment layer formation step, the etching adjustment layer is formed with a metal material containing any one of Al, Cu, Ni, Cr, and Pt.

9. The method for manufacturing a piezoelectric device according to claim 1, wherein, in the adjustment layer formation step, the etching adjustment layer is formed on a surface of the piezoelectric thin film.

10. The method for manufacturing a piezoelectric device according to claim 9, wherein, when a thickness of the first electrode formed on the rear surface of the piezoelectric thin film is defined as A,
a thickness of a second electrode formed on a surface of the piezoelectric thin film is defined as B,
a thickness of the etching adjustment layer is defined as C,
an etching rate of the first electrode is defined as $\alpha$,
an etching rate of the second electrode is defined as $\beta$, and
an etching rate of the etching adjustment layer is defined as $\gamma$,
in the adjustment layer formation step, the etching adjustment layer is formed with a thickness and a material which satisfy an equation of $A/\alpha+B/\beta=C/\gamma$.

11. The method for manufacturing a piezoelectric device according to claim 10, wherein, in the adjustment layer formation step, the etching adjustment layer whose thickness and material are the same as those of the first electrode and the second electrode.

12. The method for manufacturing a piezoelectric device according to claim 1, wherein
the sacrificial layer removal step is performed on a substrate at a wafer level in which a plurality of piezoelectric devices can be simultaneously formed, each including the sacrificial layer, and
the method includes a dividing step of dividing the substrate into the plurality of piezoelectric devices after the sacrificial layers are removed.

* * * * *